US009318337B2

(12) United States Patent
Bo et al.

(10) Patent No.: US 9,318,337 B2
(45) Date of Patent: Apr. 19, 2016

(54) THREE DIMENSIONAL THREE SEMICONDUCTOR HIGH-VOLTAGE CAPACITORS

(71) Applicant: Texas Instruments Incorporated, Dallas, TX (US)

(72) Inventors: Xiangzheng Bo, Plano, TX (US); Douglas T. Grider, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/489,403

(22) Filed: Sep. 17, 2014

(65) Prior Publication Data

US 2015/0076577 A1 Mar. 19, 2015

Related U.S. Application Data

(60) Provisional application No. 61/878,805, filed on Sep. 17, 2013.

(51) Int. Cl.

| | |
|---|---|
| ***H01L 27/108*** | (2006.01) |
| ***H01L 21/28*** | (2006.01) |
| ***H01L 27/06*** | (2006.01) |
| ***H01L 29/94*** | (2006.01) |
| ***H01L 27/115*** | (2006.01) |
| ***H01L 49/02*** | (2006.01) |

(52) U.S. Cl.

CPC ...... *H01L 21/28273* (2013.01); *H01L 27/0629* (2013.01); *H01L 27/11531* (2013.01); *H01L 28/60* (2013.01); *H01L 29/94* (2013.01)

(58) Field of Classification Search

CPC .................... H01L 21/28273; H01L 27/0629; H01L 27/11531; H01L 29/94

USPC ........................... 257/298, 532; 438/250, 253

See application file for complete search history.

(56) References Cited

U.S. PATENT DOCUMENTS

| | | | | |
|---|---|---|---|---|
| 6,190,964 | B1 * | 2/2001 | Winters | 438/254 |
| 6,902,939 | B2 | 6/2005 | Moise et al. | |
| 2003/0013255 | A1 * | 1/2003 | Lojek et al. | 438/266 |
| 2009/0230449 | A1 * | 9/2009 | Sakaguchi et al. | 257/298 |

* cited by examiner

*Primary Examiner* — Trung Q Dang

(74) *Attorney, Agent, or Firm* — Rose Alyssa Keagy; Frank D. Cimino

(57) ABSTRACT

An integrated circuit capacitor. The capacitor includes a substrate, a first conductor, and a first insulating region between the first conductor and the substrate. The capacitor also includes a second conductor, a second insulating region between the first conductor and the second conductor, a third conductor, and a third insulating region between the first conductor and the third conductor. The capacitor also includes a fourth conductor and a fourth insulating region between the first conductor and the fourth conductor.

16 Claims, 8 Drawing Sheets

THREE DIMENSIONAL THREE SEMICONDUCTOR HIGH-VOLTAGE CAPACITORS

CROSS-REFERENCES TO RELATED APPLICATIONS

This application claims priority to, the benefit of the filing date of, and hereby incorporates herein by reference, U.S. Provisional Patent Application 61/878,805, entitled "THREE DIMENSIONAL FLOATING GATE HIGH-VOLTAGE CAPACITORS," and filed Sep. 17, 2013.

STATEMENT REGARDING FEDERALLY SPONSORED RESEARCH OR DEVELOPMENT

Not Applicable.

BACKGROUND OF THE INVENTION

The preferred embodiments relate to integrated circuit manufacture and devices and, more particularly, to three dimensional integrated circuit capacitors.

Integrated circuits typically include numerous devices and interconnections, formed relative to a semiconductor substrate. These devices may include transistors, capacitors, resistors, and others. As technology advances, these devices become smaller, yet considerations such as performance, reliability, and cost remain vitally important. The preferred embodiments relate primarily to capacitors, and for such devices therefore a desirable goal is to achieve sufficient and sometimes relatively large capacitance within a particular area or volume, with another goal being the use of such a capacitance in higher voltage applications.

Integrated circuit capacitors in connection with the above considerations have included what are sometimes categorized as either two or three dimensional architectures. A typical two-dimensional integrated circuit capacitor is formed by including an insulating layer, having a dielectric constant, between two planar conductors. For example, such a capacitor may be formed by locating an insulating layer between a first conductor, such as be a doped semiconductor region, polysilicon layer, or a semiconductor substrate, and a second conductor, such as a layer of doped polysilicon. A three dimensional integrated circuit capacitor is so named because the path from one conductor to the other, through the intermediate insulating dielectric, extends in more than one direction. Certain examples may be found in U.S. Pat. No. 6,902,939, entitled "Integrated Circuit and Method," issued Jun. 7, 2005, such as in its FIGS. 13*a* through 13*i*.

Given the preceding, the present inventors seek to improve upon the prior art, as further detailed below.

BRIEF SUMMARY OF THE INVENTION

In a preferred embodiment, there is an integrated circuit capacitor. The capacitor includes a substrate, a first conductor, and a first insulating region between the first conductor and the substrate. The capacitor also includes a second conductor, a second insulating region between the first conductor and the second conductor, a third conductor, and a third insulating region between the first conductor and the third conductor. The capacitor also includes a fourth conductor and a fourth insulating region between the first conductor and the fourth conductor.

Numerous other inventive aspects are also disclosed and claimed.

DETAILED DESCRIPTION OF EMBODIMENTS

FIGS. 1 through 9 illustrate cross-sectional views of the formation of a capacitor 10 according to preferred embodiments. Similarly, FIGS. 10 through 13 illustrate top views relative to some of FIGS. 1 through 9. The following discussion is by way of enabling one skilled in the art to practice the preferred embodiments, while the reader should recognize that numerous semiconductor fabrication, structure, and related details are known by, or ascertainable to, one skilled in the art. Certain materials, process details, and dimensions, therefore, are omitted., as they are otherwise known and not necessary to demonstrate the inventive scope.

Figure 1:
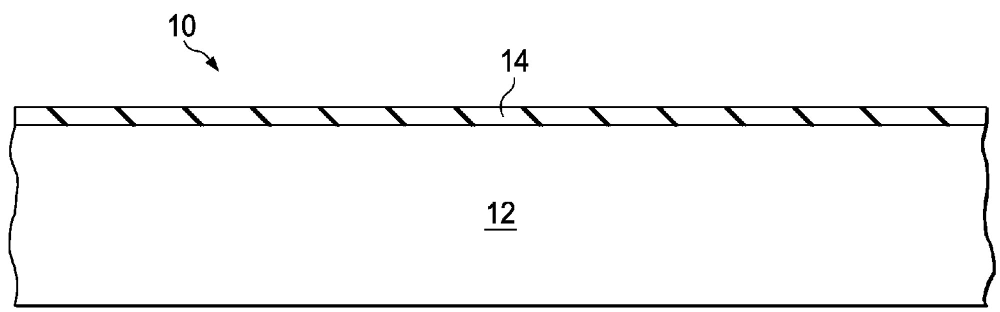
FIGS. 1 through 9 illustrate cross-sectional views of the formation of a capacitor 10 according to preferred embodiments.

In FIG. 1, capacitor 10 is formed relative to a semiconductor substrate 12, which typically is a p-type semiconductor material. As well known, alternatively an n-type material may be used. In any event, the materials for other semiconductor regions herein are to be complementary to those described relative to the (e.g., p-type) semiconductor material used in the example provided. Further in FIG. 1, an insulating layer 14 is formed along a surface of substrate 12. As with various insulators herein, each insulator has a corresponding dielectric constant. Accordingly, ad as appreciated later, when an insulating layer is between two conductors, a capacitive element may be realized.

Figure 2:
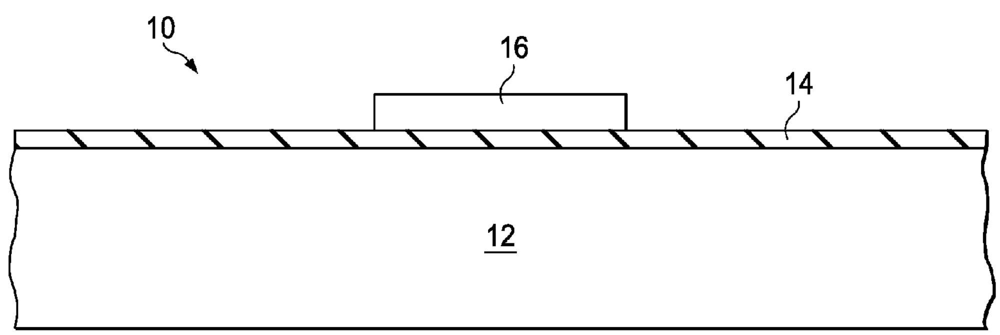
Figure 10:
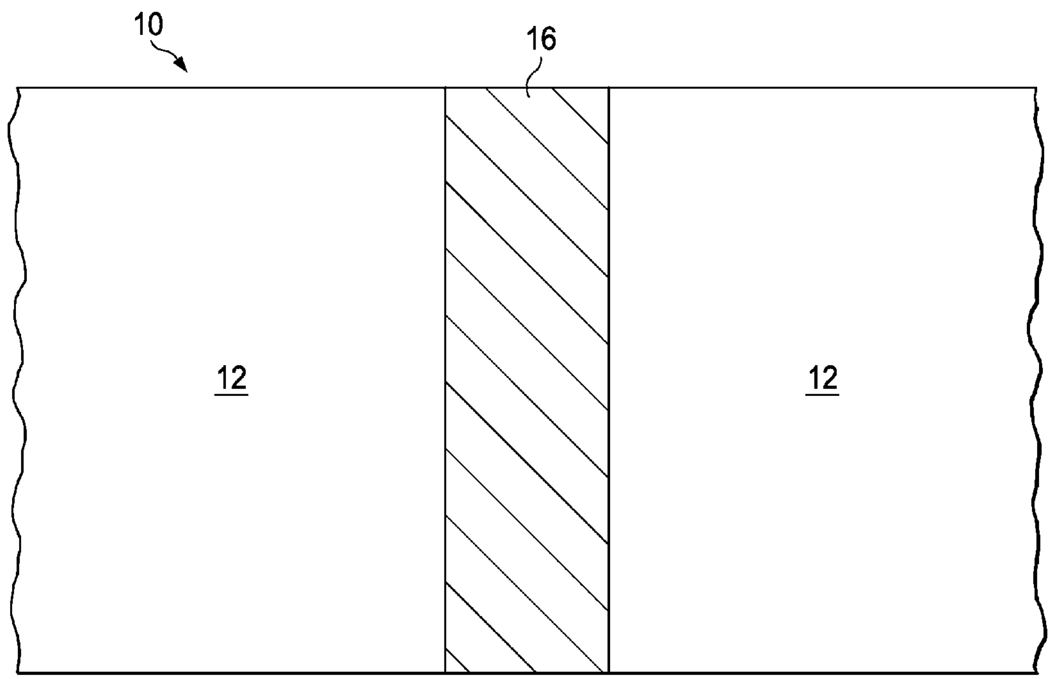
FIGS. 10 through 13 illustrate top views relative to some of FIGS. 1 through 9.
Figure 11:
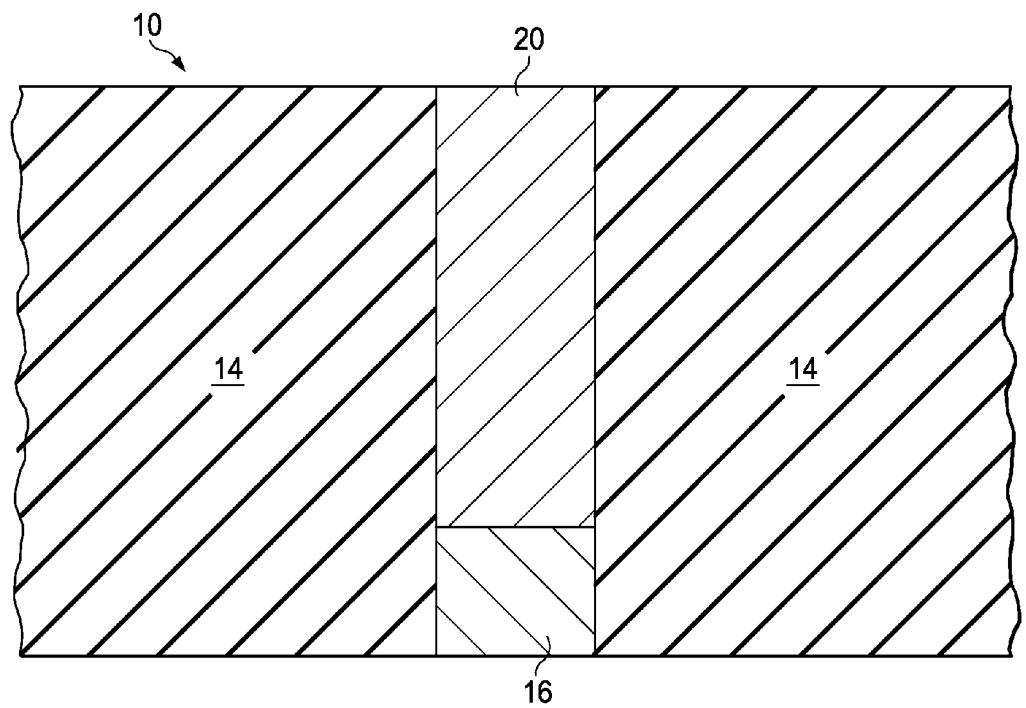

In FIG. 2, a first conductor 16 is formed along a portion of insulating layer 14. In one preferred embodiment, first conductor 16 may be formed from a first layer of polysilicon that is formed, patterned, doped so as to achieve a desired level of conductivity, and etched, so as to leave a portion of that layer as first conductor 16. FIG. 10 also illustrates a top down view of first conductor 16 and substrate 12.

Figure 3:
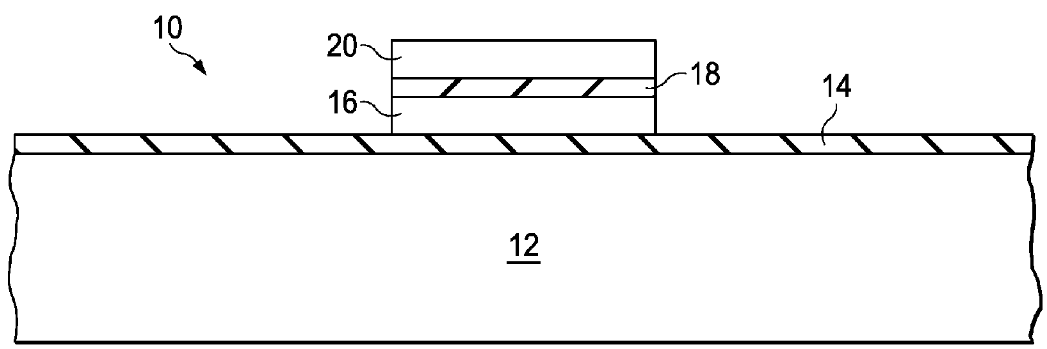

In FIG. 3, an insulating layer 18 is formed along the upper surface of first conductor 16, that is, on the surface opposite that contacting insulating layer 14. Additionally, a second conductor 20 is formed along a surface of insulating layer 18. In one preferred embodiment, second conductor 20, like first conductor 16, also may be formed from a layer of polysilicon that is formed, patterned, doped so as to achieve a desired level of conductivity, and etched, so as to leave a portion of that layer as second conductor 20. Indeed, the formation of first conductor 16 and second 20 together are sometimes what is referred to as part of a two-polysilicon process. In this regard, first conductor 16 is the "first poly" and second conductor 20 is the "second poly." FIG. 11 also illustrates a top down view of the added second conductor 20. For reasons of facilitating a separate contact discussed later, and only by way of illustration, note further from the top view of FIG. 11 that a portion of first conductor 16 extends laterally beyond the overlying second conductor 20.

Figure 4:
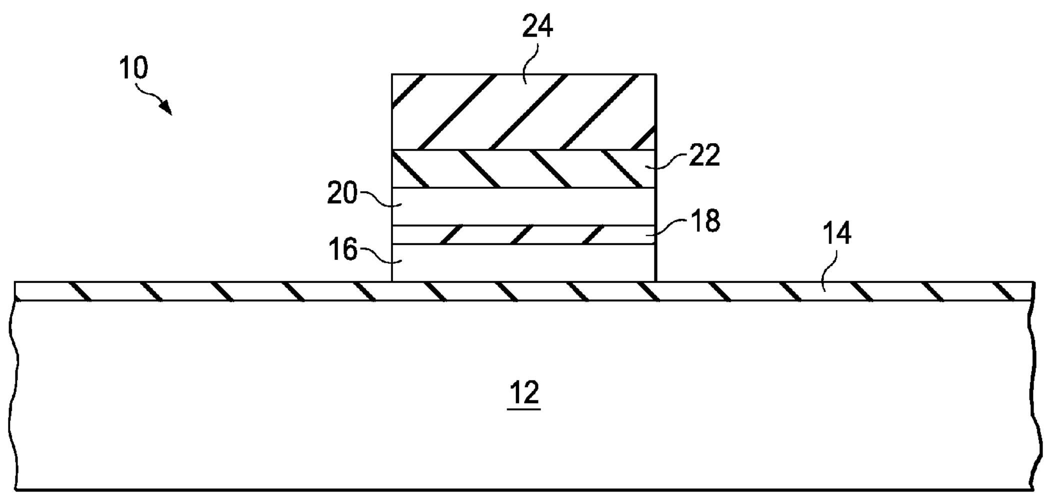

In FIG. 4, additional insulation is formed over second conductor 20. In one preferred embodiment and for reasons evident later, the additional insulation may be formed in different steps and/or using differing materials. For example, in such a preferred embodiment, a first insulating region 22 is formed of TEOX oxide over second conductor 20, and a second insulating region 24 is formed of nitride over first insulating region 22. Alternatively, however, a single insulating region could replace first insulating region 22 and second insulating region 24.

Figure 5:
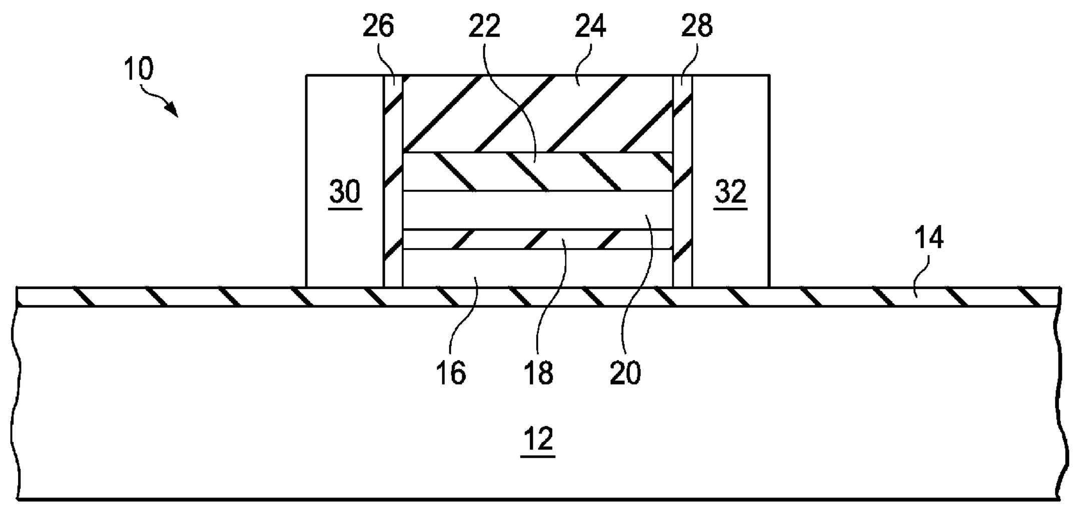

In FIG. 5, insulating sidewalls 26 and 28 are formed along the vertical stack of FIG. 4 (i.e., all of 16, 18, 20, 22, and 24). Insulating sidewalls 26 and 28 may be formed using various techniques, with one example being a tetraethooxysihme (TEOS) process. Additionally, in preferably a third polysilicon layer (e.g., of a three-polysilicon process), a first conductive sidewall 30 and a second conductive sidewall 32 are formed, adjacent each of respective insulating sidewalls 26 and 28. Thus, in one preferred embodiment, first conductive sidewall 30 and second conductive sidewall 32, like first conductor 16 and second conductor 20, also may be formed from a layer of polysilicon that is formed, patterned, doped so as to achieve a desired level of conductivity, and etched, so as to leave portions of that layer.

Figure 6:
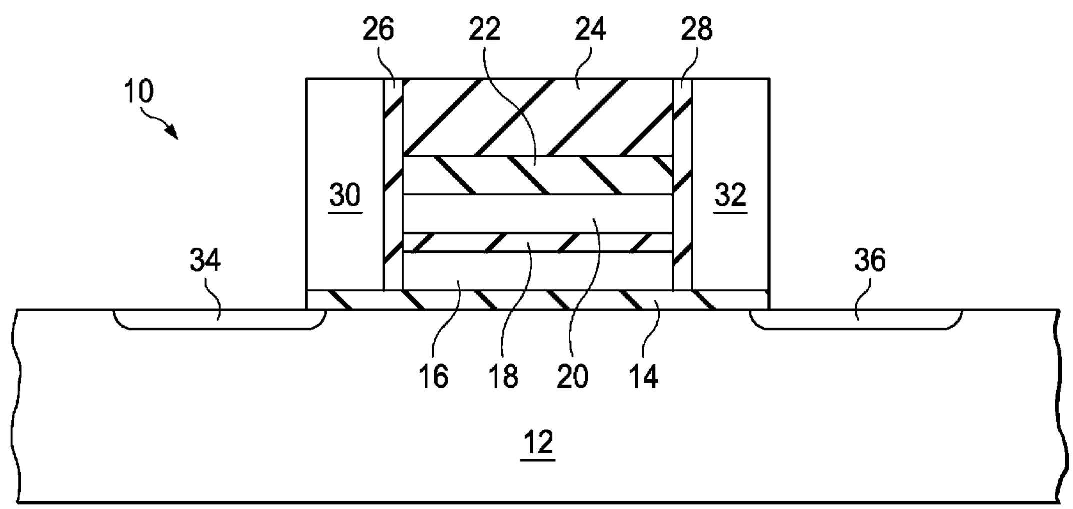
Figure 12:
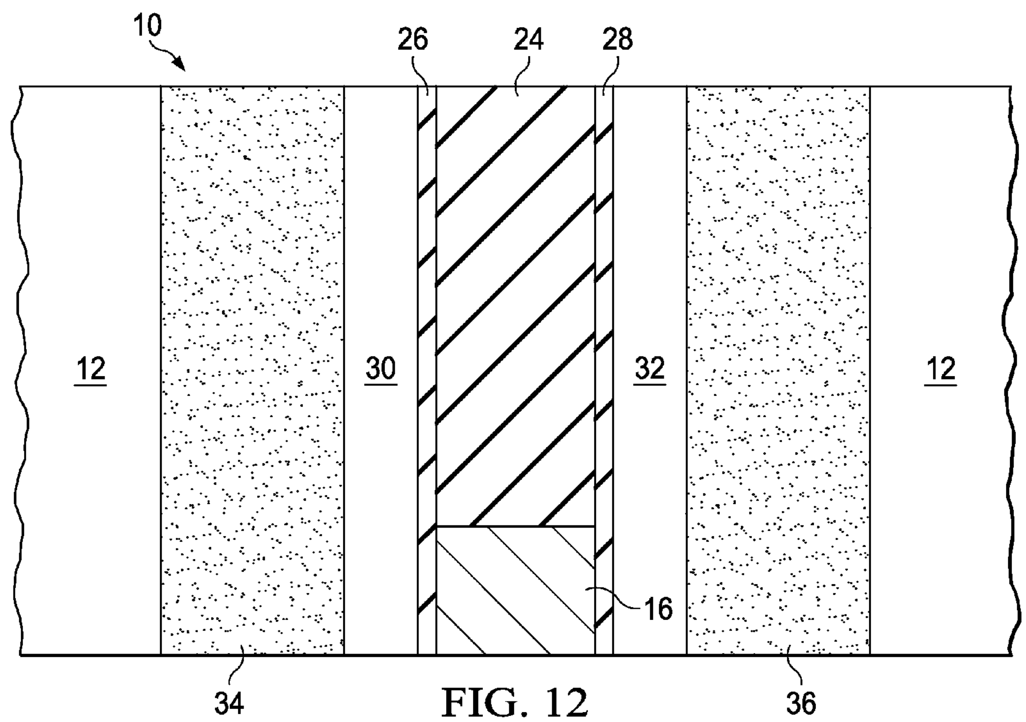

In FIG. 6, conductive regions 34 and 36 are formed within semiconductor substrate 12, and preferably aligned, respectively, with respect to first conductive sidewall 30 and second conductive sidewall 32. Indeed, as known in the semiconductor transistor art, conductive regions 34 and 36 may be formed by implanting dopants (e.g., n+ dopants) that will self-align and encroach somewhat horizontally, as shown by the reach of regions 34 and 36 each extending slightly under first conductive sidewall 30 and second conductive sidewall 32, respectively. FIG. 12 also illustrates a top down view of the added insulating sidewalls 26 and 28, first conductive sidewall 30 and second conductive sidewall 32, and conductive regions 34 and 36.

Figure 7:
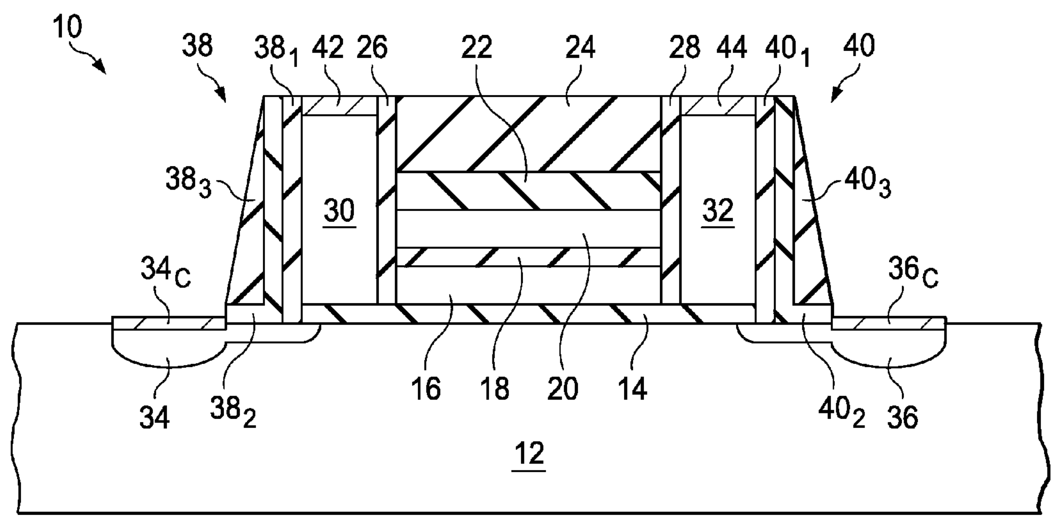

In FIG. 7, insulating sidewalls 38 and 40 are formed adjacent to and along the side of conductive sidewalls 30 and 32, respectively. In different preferred embodiments, each of insulating sidewalls 38 and 40 may be formed of multiple layers; for example as shown in FIG. 7, each of insulating sidewalls 38 and 40 includes three different comparable layers. For example, insulating sidewall 38 includes: (i) a first oxide layer $\mathbf{38}_1$ along the sidewall of first conductive sidewall 30; (ii) a second L-shaped nitride layer $\mathbf{38}_2$; and (iii) a curved oxide portion layer $\mathbf{38}_3$, typically formed using an isotropic etch, so as to fill the outer region of the L-shaped second layer $\mathbf{38}_2$. Similar structure and observations will be recognized by one skilled in the art with respect to insulating sidewall 40. After insulating sidewalls 38 and 40 are formed, preferably an additional dopant implant, sometimes referred to in the transistor art as a source/drain deep implant, is preformed, causing a respective deeper region to be formed in each of conductive regions 34 and 36, where the deeper region is also self-aligned relative to the respective insulating sidewall 38 and 40. Lastly in FIG. 7, conductor regions 42 and 44 are formed above first conductive sidewall 30 and second conductive sidewall 32, respectively. These conductor regions 42 and 44 may be formed, for example, by silicidation of the top of each of conductive sidewalls 30 and 32. The silicidation also forms conductor regions $\mathbf{34}_C$ and $\mathbf{36}_C$ at the top of the exposed portions of conductive regions 34 and 36, respectively.

Figure 8:
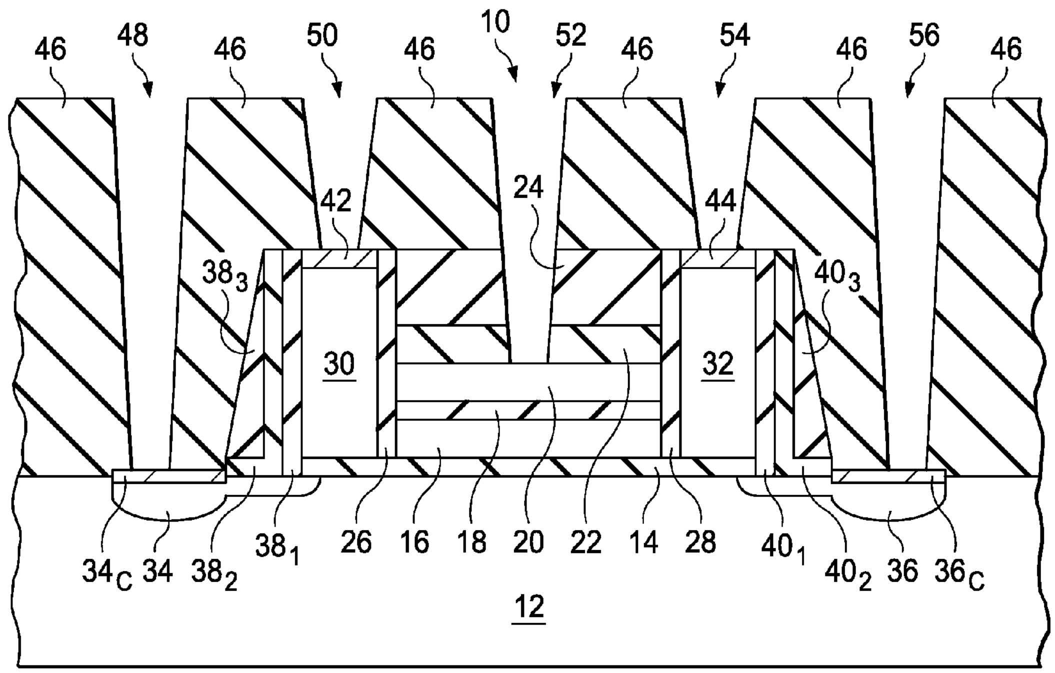

In FIG. 8, an insulating layer 46 is formed over the entire structure. Moreover and for reasons more clear below, five contact openings 48, 50, 52, 54, and 56 are formed through insulating layer 46, as may be referred to as vias or the like. Moreover, opening 52 also extends through first insulating region 22 and second insulating region 24. As shown below, each opening allows formation of a respective contact, with the following Table 1 depicting the opening number and the component to which a contact may be formed:

TABLE 1

| Opening | Region to contact |
|---|---|
| 48 | conductive region 34 |
| 50 | conductor region 42 |
| 52 | second conductor 20 |
| 54 | conductor region 44 |
| 56 | conductive region 36 |

Figure 9:
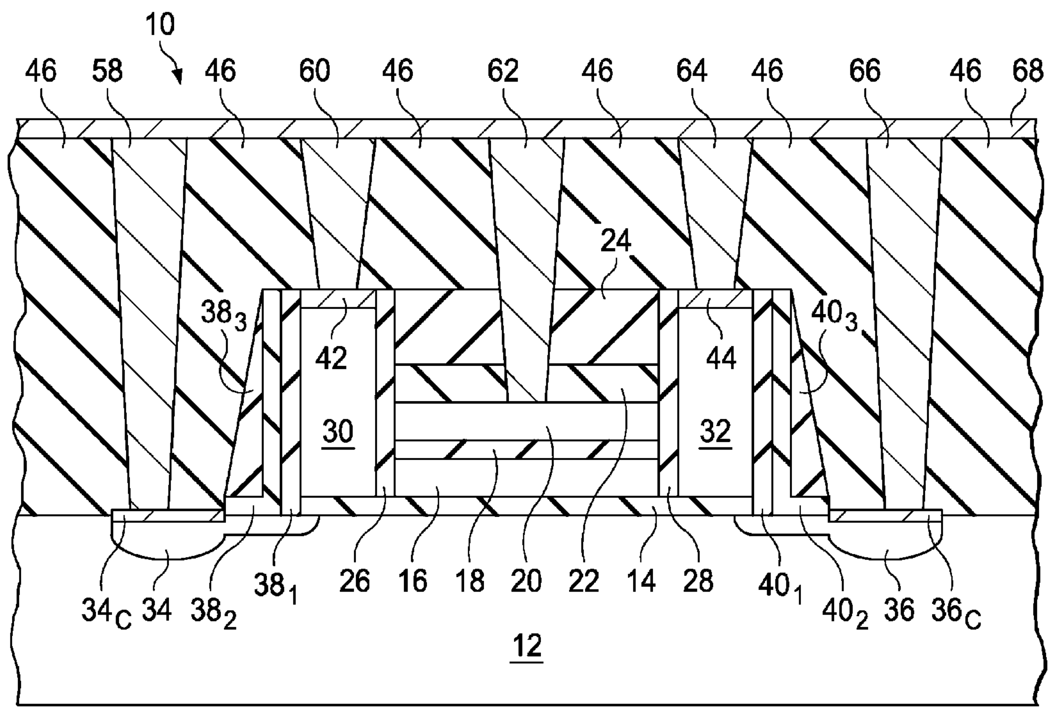
Figure 13:
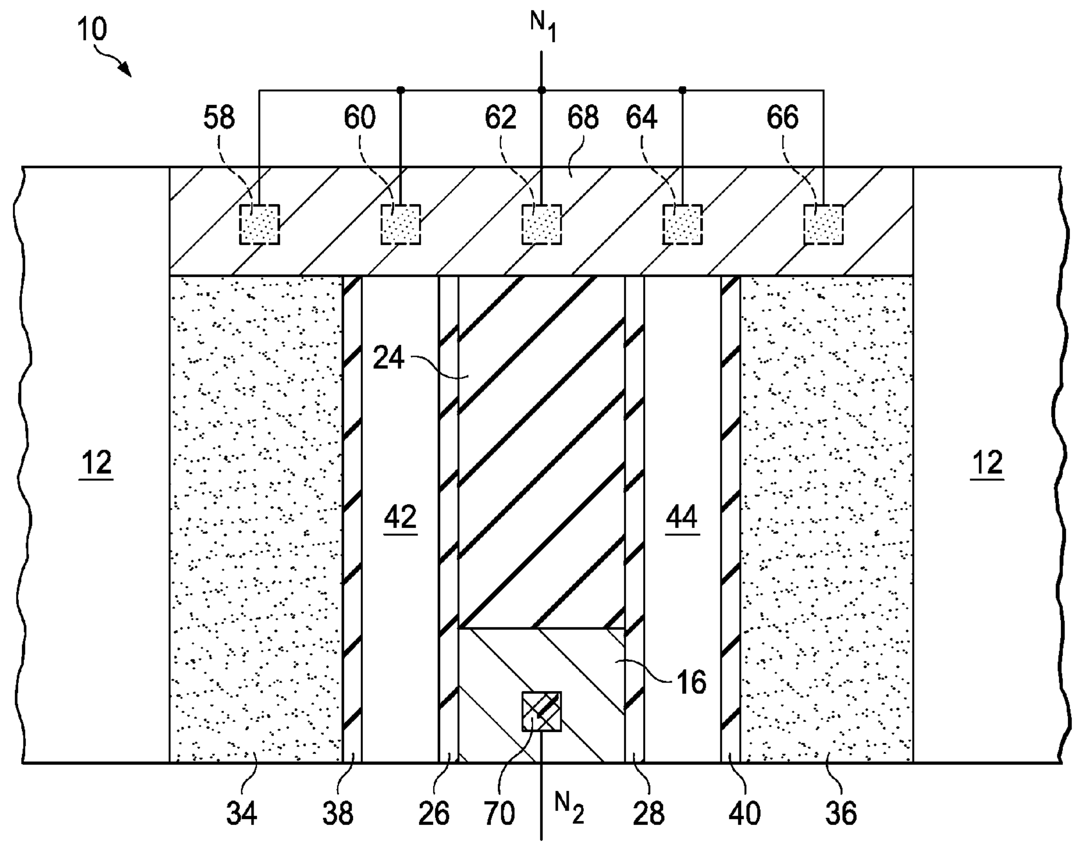

In FIG. 9, respective metal contacts 58, 60, 62, 64, and 66 are formed in what was shown as contact openings 48, 50, 52, 54, and 56 in FIG. 8. Each of contacts 58, 60, 62, 64, and 66, therefore, permits electrical connectivity to the respective region indicated in the right column of Table 1. Further, a conductive layer (e.g., metal layer) 68 is formed above and in electrical communication with metal contacts 58, 60, 62, 64, and 66, thereby connecting all of those contacts, and the regions to which they extend, as a single electrical node. FIG. 13 also illustrates metal layer 68, and below it shown in dashed lines are metal contacts 58, 60, 62, 64, and 66. As shown schematically, therefore, these connections provide a first node, $N_1$. Also as shown in FIG. 13, however, an additional separate contact 70 is made to first conductor 16, thereby providing a second node, $N_2$.

Figure 14:
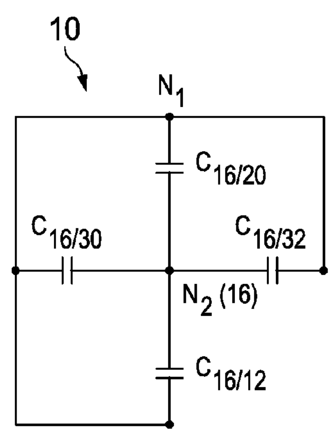
FIG. 14 illustrates a schematic view of capacitor 10

FIG. 14 illustrates a schematic view of capacitor 10, as should now be appreciated by one skilled in the art given the previous structure and fabrication discussion. Specifically, as shown in both FIG. 14 and above, capacitor 10 includes two nodes, $N_1$ and $N_2$, separated by dielectric insulators and thereby providing a particular amount of capacitance. As more readily demonstrated in the schematic, the total capacitance of capacitor 10 has various contributing capacitances, all connected in parallel between nodes $N_1$ and $N_2$. In FIG. 14, four such capacitances are shown, and the subscript for each uses the reference number pair of the respective conductors in the earlier-described Figures, with each being separated by an insulating dielectric. For example, a capacitor $C_{16/12}$ is shown in FIG. 10, corresponding to first conductor 16 and substrate 12, with the above having described and illustrated an insulating layer 14 between the two. As another example, capacitor $C_{16/30}$ is shown in FIG. 14, corresponding to first conductor 16 and first conductive sidewall 30, with the above having described and illustrated an insulating sidewall 26 between the two. As a similar example, capacitor $C_{16/32}$ is shown in FIG. 14, corresponding to first conductor 16 and second conductive sidewall 32, with the above having described and illustrated an insulating sidewall 28 between the two. As a final example, capacitor $C_{16/20}$ is shown in FIG. 14, corresponding to first conductor 16 and second conductor 20, with the above having described and illustrated an insulating layer 18 between the two.

Figure 15:
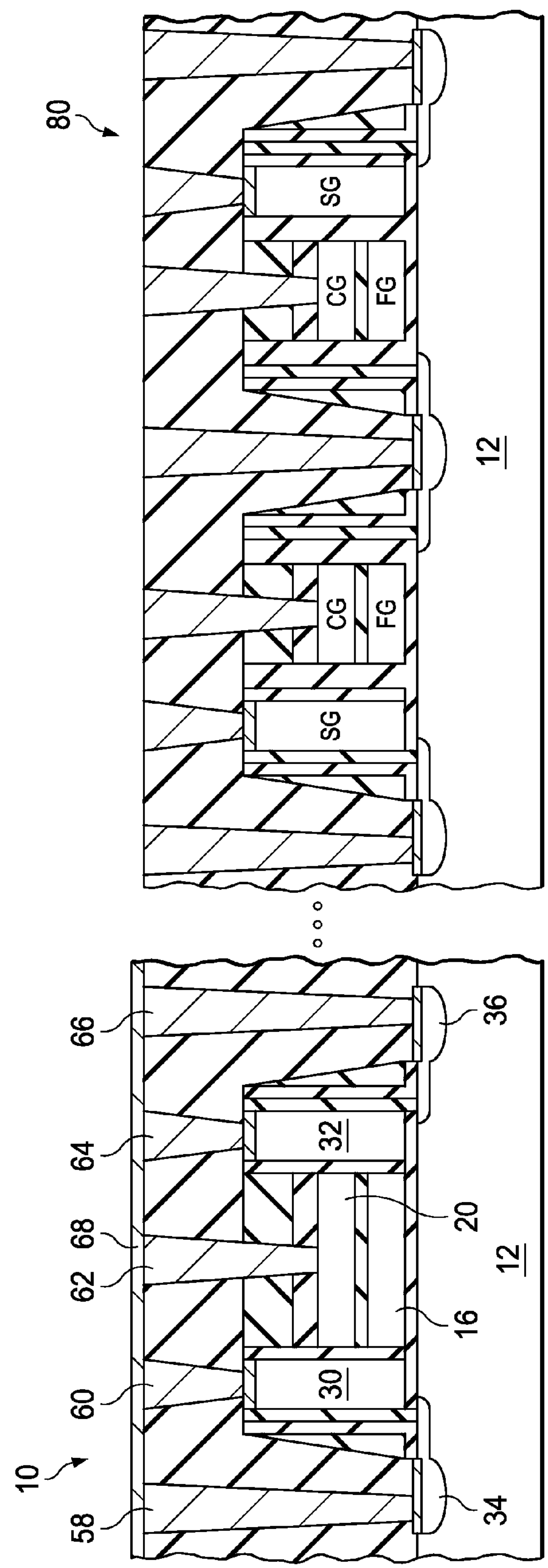
FIG. 15 illustrates the cross-sectional view of the capacitor of FIG. 9 in combination with a floating gate bitcell.

Given the preceding, one skilled in the art will appreciate that the preferred embodiments include a three dimensional capacitor 10, with the ability to achieve relatively large capacitance values in a relatively limited volumetric structure (i.e., in directions beyond simply between just two planes). Moreover, the inventors further recognize that a preferred embodiment may be formed as part, or by modification, of a three-polysilicon (sometimes referred to as “three-poly” process). For example, three-poly processes are heretofore know for use in certain flash bitcell formation, whereby a first poly forms a floating gate, a second poly forms a control gate, and the third poly forms the wordline, relative to the floating and control gates. In this regard, therefore, by adjusting steps or structure (e.g., including masking), the preferred embodiment capacitor 10 may be formed during the same three-poly steps that form a floating gate bitcell. In order to illustrate this additional preferred embodiment, FIG. 15 illustrates an additional cross-sectional view of capacitor 10 from FIG. 9, and in connection with the same substrate and many of the same structures, certain modifications may be made to provide, as shown to the right of the Figure, so as to contemporaneously form a floating gate bitcell 80 in the same substrate 12 as capacitor 10. Thus, one skilled in the art will appreciate that bitcell 80 includes a first poly floating gate FG, in a stack with a second poly control gate CG. Moreover, a third poly is used to form a sidegate SG, on one side of the stack, for reading cell 80. The remaining illustrated aspects (e.g., clearing the cell state) are known in the art and will be appreciated as being created using the same steps, or slightly modified steps, as those used to form capacitor 10.

With the above aspects, the preferred embodiments contemplate achieving a high capacitance three dimensional capacitor. Based on the thickness of the insulating dielectrics and poly layer geometry, the three dimensional capacitor 10 capacitance can be roughly calculated to be ~0.165 fF. Reducing critical dimensions of first conductive sidewall 30 and second conductive sidewall 32 may lead to the capacitor area ~0.045 $\mu m^2$. The capacitance/area ratio is ~3.6 fF/$\mu m^2$. Further increasing first conductor 16 and second conductor 20 critical dimension by keeping first conductor 16 and second conductor 20 space and third poly (e.g., first conductive sidewall 30 and a second conductive sidewall 32) unchanged can further increase this ratio. As a comparison, one can calculate a two-dimensional capacitance/area ratio. In certain existing three poly bitcell processes, the thinnest dielectric around the floating gate is the oxide on top of the substrate, ~115 Å. If using this dielectric material forms a two-dimensional MOSCAP capacitor, the capacitance/area ratio $\in_{SiO}$/115 Å, ~3.0 fF/$\mu m^2$, which is ~20% less than the preferred embodiment capacitor 10. Moreover, as technology scales down further, the three dimensional preferred embodiment capacitor capacitance/area ratio can further increase significantly. For 40 nm three-poly flash cell, this ratio can increase up to ~4.5, if FG gate oxide thickness keeps at 115 Å, for example for automotive application. This is ~50% increase of capacitance/area ratio than two-dimensional MOSCAP. Moreover, since minimum thickness of dielectric material in the three dimensional preferred embodiment capacitor is 115 Å, relatively high voltage up to 10V can be applied to the capacitor. As a reference, some existing process capacitors have has capacitance/area ratio ~1.7 fF/$\mu m^2$, which is ~53% less than the preferred embodiment.

From the above, various embodiments provide numerous improvements to integrated circuit capacitors. Various aspects have been described, and still others will be ascertainable by one skilled in the art from the present teachings. Still further, while various alternatives have been provided according to the disclosed embodiments, still others are contemplated and yet others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. An integrated circuit capacitor, comprising:

a substrate;

a first conductor;

a first insulating region between the first conductor and the substrate;

a second conductor;

a second insulating region between the first conductor and the second conductor;

a third conductor;

a third insulating region between the first conductor and the third conductor, the third conductor being electrically insulated from the first conductor and also the second conductor;

a fourth conductor; and a fourth insulating region between the first conductor and the fourth conductor, the fourth conductor being electrically insulated from the first conductor and also the second conductor.

2. The capacitor of claim 1 and further comprising at least one conductive region formed in the semiconductor substrate.

3. The capacitor of claim 2 and further comprising a connecting conductor connected to each of the second conductor, the third conductor, the fourth conductor, and the at least one conductive region.

4. The capacitor of claim 3 wherein the connecting conductor comprises a first node of the capacitor, and wherein the first conductor comprises a second node of the capacitor.

5. The capacitor of claim 1 and further comprising at least two conductive regions formed in the semiconductor substrate.

6. The capacitor of claim 5 and further comprising a connecting conductor connected to each of the second conductor, the third conductor, the fourth conductor, and the at least two conductive regions.

7. The capacitor of claim 6 wherein the connecting conductor comprises a first node of the capacitor, and wherein the first conductor comprises a second node of the capacitor.

8. The capacitor of claim 1 wherein the first conductor and the second conductor comprise a stack relative to the substrate.

9. The capacitor of claim 8:

wherein the third conductor is adjacent a first side of the stack; and wherein the fourth conductor is adjacent a second side of the stack, opposite the first side of the stack.

10. The capacitor of claim 1 wherein the first conductor is formed from a first polysilicon layer in a three polysilicon layer process.

11. The capacitor of claim 10 wherein the second conductor is formed from a second polysilicon layer in a three polysilicon layer process.

12. The capacitor of claim 11 wherein at least one of the third conductor and the fourth conductor are formed from a second polysilicon layer in a three polysilicon layer process.

13. The capacitor of claim 12 and further comprising a floating gate bitcell formed in relation to the substrate.

14. The capacitor of claim 13 wherein the floating gate bitcell comprises:

a floating gate formed from the first polysilicon layer in the three polysilicon layer process;

a control gate formed from the second polysilicon layer m the three polysilicon layer process; and a word line, and an erase gate, wherein at least one of the word line and the erase gate is formed from the third polysilicon layer in the three polysilicon layer process.

15. The capacitor of claim 1 and further comprising a floating gate bitcell formed in relation to the substrate.

16. A method of forming an integrated circuit capacitor relative to a substrate, comprising:

forming a first conductor;
forming a first insulating region between the first conductor and the substrate;
forming a second conductor;
forming a second insulating region between the first conductor and the second conductor;
forming a third conductor;
forming a third insulating region between the first conductor and the third conductor, the third conductor being electrically insulated from the first conductor and also the second conductor;
forming a fourth conductor; and
forming a fourth insulating region between the first conductor and the fourth conductor, the fourth conductor being electrically insulated from the first conductor and also the second conductor.

* * * * *